United States Patent [19]

Elabd

[11] Patent Number: 4,688,066
[45] Date of Patent: Aug. 18, 1987

[54] OPPOSITE DIRECTION MULTIPLE-PHASE CLOCKING IN ADJACENT CCD SHIFT REGISTERS

[75] Inventor: Hammam Elabd, Mercer County, N.J.

[73] Assignee: RCA Corporation, Princeton, N.J.

[21] Appl. No.: 815,304

[22] Filed: Dec. 30, 1985

Related U.S. Application Data

[63] Continuation of Ser. No. 646,103, Aug. 31, 1984, abandoned.

[51] Int. Cl.[4] .................... H01L 29/78; H01L 29/04; G11C 19/28
[52] U.S. Cl. ........................................ 357/24; 357/59; 377/62
[58] Field of Search ................. 357/24, 59; 377/57–63

[56] References Cited

U.S. PATENT DOCUMENTS

| | | | |
|---|---|---|---|
| 3,760,202 | 9/1973 | Kosonocky | 357/24 |
| 3,921,194 | 11/1975 | Engeler et al. | 357/24 |
| 3,921,195 | 11/1975 | Smith et al. | 357/24 |
| 3,961,352 | 6/1976 | Colton et al. | 357/24 |
| 4,262,297 | 4/1981 | Partridge | 357/24 |

OTHER PUBLICATIONS

Sequin et al., "Charge-Coupled Area Image Sensor Using Three Levels of Polysilicon", *IEEE Trans. on Elec. Devices,* vol. ED-21, No. 11, 11/74, pp. 712–720.
Sequin et al., *Charge Transfer Devices,* Academic Press, NY, 1975, p. 38.
Bertram et al., "A Three-Level Metallization Three-Phase CCD", *IEEE Trans. on Elec. Devices,* vol. ED-21, No. 12, 12/74, pp. 758–767.

*Primary Examiner*—Gene M. Munson
*Attorney, Agent, or Firm*—Eugene M. Whitacre; Paul J. Rasmussen; Peter M. Emanuel

[57] ABSTRACT

Parallelled charge transfer channels have multiple-phase-clocked gate electrodes overspanning them in one of a number of arrangements conditioning the transfer of charge packets in opposing directions in adjacent charge transfer channels. Three-phase, four-phase, five-phase and six-phase clocking arrangements constructed in three layers of polysilicon embody the invention.

7 Claims, 5 Drawing Figures

OPPOSITE DIRECTION MULTIPLE-PHASE CLOCKING IN ADJACENT CCD SHIFT REGISTERS

The invention described herein was made in performance of work under NASA Contract No. NAS 5-27505 and is subject to the provisions of Section 305 of the National Aeronautics and Space Act of 1958 (72 Stat. 435; 42 U.S.C. 2457).

This application is a file-wrapper continuing application (filed pursuant to 37 CFR 1.62) of application Ser. No. 646,103 filed Aug. 31, 1984, now abandoned.

FIELD OF THE INVENTION

The present invention relates to charge coupled device (CCD) shift registers in parallel alignment to which clocking signals are applied for advancing charge packets in opposite directions in adjacent shift registers.

BACKGROUND OF THE INVENTION

Such an arrangement is known for CCD shift registers clocked in two phases. In this prior art CCD circuitry pairs of first-polysilicon-layer and second-polysilicon-layer gate electrode structures cross adjacent charge transfer channels. The first-layer and second-layer gate electrode structures in each pair meander back and forth respective to each other to appear in opposite order in adjacent charge transfer channels, each cross-over/cross-under taking place over a channel stop between adjacent charge transfer channels. Both the gate electrodes in each pair are connected to receive the same phase of clocking signal, and each succeeding pair of gate electrodes receives the phase of two-phase clocking signal complementary to the phase received by the preceding pair. The second-polysilicon-layer gate electrodes have barrier implantations into the substrate beneath them to determine the direction of charge transfer from the first-polysilicon-layer gate electrode towards the second-polysilicon-layer electrode for each pair of gate electrodes. Because of the cross-meandering of the pair of electrodes so they appear in opposite order in adjacent charge transfer channels, charge transfer is in opposing directions in adjacent charge transfer channels.

It is desirable to clock CCD shift registers in at least three phases, however, to obtain the best yields of usable devices during semiconductor device manufacturing. Short-throughs between overlapping polysilicon layers which render a two-phase CCD shift register useless can be tolerated in multiple-phase CCD shift registers. CCD shift registers with multiple-phase clocking also have greater dynamic range since the fraction of the charge transfer channel taken up by potential barriers is smaller respective to the fraction of the channel in which potential wells are available for holding charge.

Control of the direction of charge transfer in CCD shift registers using multiple-phase clocking signals is not normally determined by barrier implantations, but rather by the order in which the gate electrodes having different phases of clocking appear across the charge transfer channel. Multiple-phase-clocked CCD shift registers can be clocked in opposite phase sequence to reverse the direction of charge transfer, which is not possible with two-phase-clocked CCD shift registers using implanted barriers. Conventionally, clocking phases are denominated by ordinal numbers indicative of their normal order of succession in time.

Gate electrodes which meander respective to each other along their widths, the present inventor points out, can be used to re-order the appearance of clock phases to be different in adjoining charge transfer channels. A gate electrode can cross over one, or perhaps two, other gate electrodes in the area of the channel stop separating adjacent charge transfer channels. However, the number of layers of polysilicon available for gate electrode structures is usually limited to three to keep the number of manufacturing steps within reason. It is desirable that cross-overs and cross-unders can be kept in the same layer of polysilicon as the gate electrodes being connected, to avoid having to ohmically contact a top-metallization cross-over. So, lay-out problems are difficult to solve.

In CCD imagers where image integration takes place in parallel CCD shift registers, preferably the gate electrodes are arranged such that the centers of picture elements ("pixels") integrated in adjacent charge transfer channels are aligned in straight lines normal to the charge transfer channels. This imposes another constraint on lay-out.

SUMMARY OF THE INVENTION

Parallelled charge transfer channels have multiple-phase-clocked gate electrodes overspanning them in one of a number arrangements conditioning the transfer of charge packets in opposing directions in adjacent channels. Three-phase, four-phase, five-phase and six-phase clocking arrangements constructed in three layers of polysilicon each embody the invention.

In the FIGURES the first layer of polysilicon is shown in stipple; the second layer, in lower left to upper right cross hatch; and the third layer, in upper left to lower right cross hatch. The lay-outs are shown viewed from the top surface of the underlying semiconductor substrate. In this specification the words "top", "bottom", "over", "under", etc., unless otherwise specified, are used in accordance with the conventional parlance of semiconductor design engineers and do not refer to actual orientations in space that differ from that in accordance with convention. Conventionally, the polysilicon layers are ordinally numbered in order of their successive disposition over the top surface of the semiconductor substrate, and this convention is followed in the detailed description following. The first polysilicon layer per conventional CCD construction is insulated from the substrate top surface; and each succeeding polysilicon layer is insulated from the preceding polysilicon layer, insulation being provided typically by silicon oxide or nitride layers grown from a gaseous phase. Cross sections through a charge transfer channel are, substantially at least, conventional and are not illustrated by figure.

DETAILED DESCRIPTION

Figure 1:
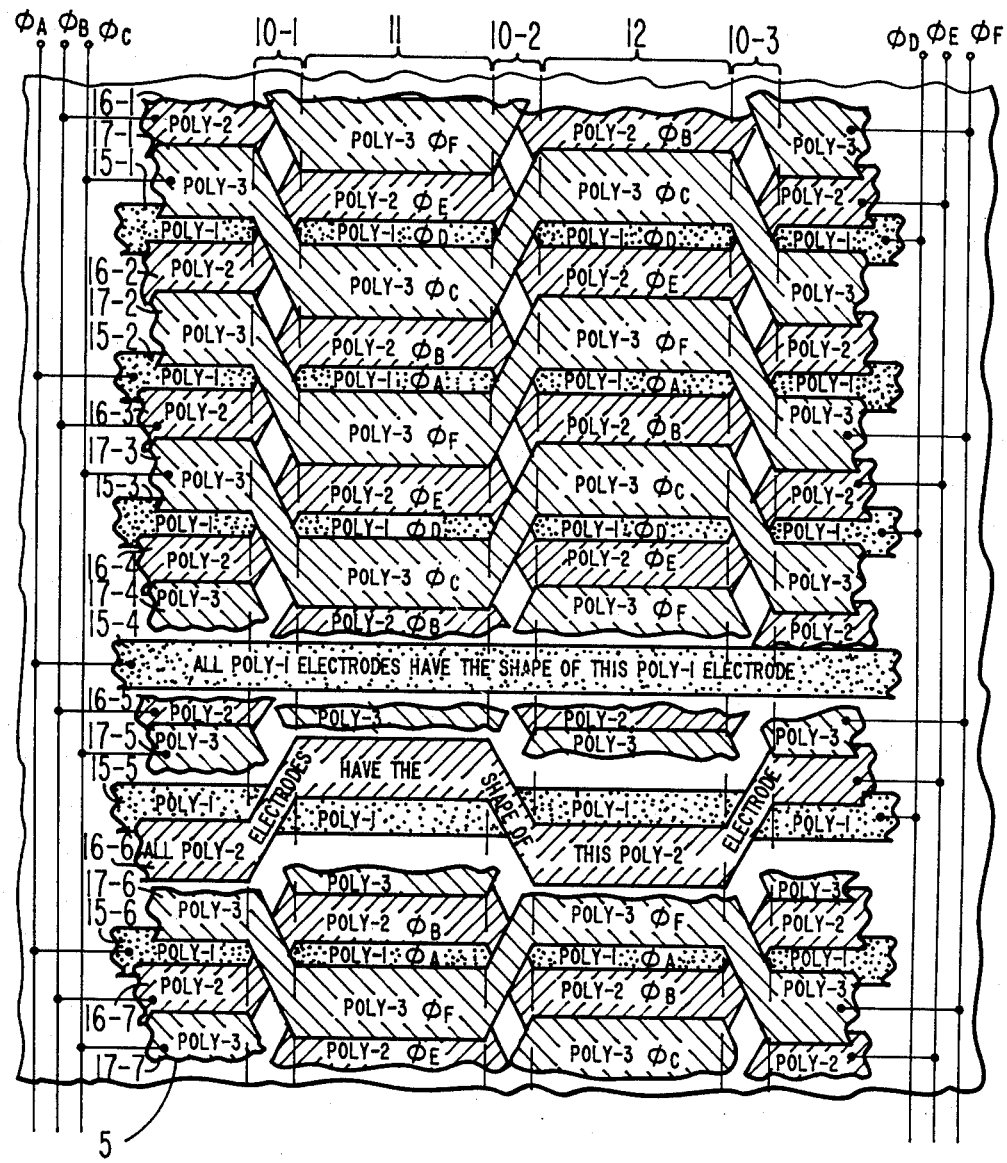
FIG. 1 is a lay-out of a gate electrode structure in three polysilicon layers, suitable for three-phase or six-phase clocking of adjacent charge transfer channels, so as to transfer charge in opposite directions in these channels in accordance with the invention.

A portion 5 of parallelled CCD shift register apparatus is shown in FIG. 1. A set 10 of parallel channel stop structures 10-1, 10-2, 10-3 (running from top to bottom of FIG. 1) define a pair of adjacent charge transfer channels 11, 12 (also running from top to bottom of FIG. 1). In each of these charge transfer channels 11, 12 charge is to be transferred in a direction opposite to the direction of charge transfer in the other. (This pair of charge transfer channels 11, 12 may be viewed as representative of any two adjacent charge transfer channels in a large array of parallelled charge transfer channels.) Charge transfer channels 11, 12 can be clocked in six successive phases $\phi_1$, $\phi_2$, $\phi_3$, $\phi_4$, $\phi_5$, $\phi_6$, applied to the terminals labelled $\phi_A$, $\phi_B$, $\phi_C$, $\phi_D$, $\phi_E$, and $\phi_F$ respectively. Alternatively, charge transfer channels 11, 12 can be clocked in three successive phases $\phi_1$, $\phi_2$, $\phi_3$, with $\phi_1$ being applied to the $\phi_A$ and $\phi_D$ terminals, with $\phi_2$ being applied to the $\phi_B$ and $\phi_E$ terminals, and with $\phi_3$ applied to the $\phi_C$ and $\phi_F$ terminals. The $\phi_A$, $\phi_B$, $\phi_C$, $\phi_D$, $\phi_E$, and $\phi_F$, terminals are represented as being connected via top metallization to the gate electrodes in the various layers of polysilicon. However, in practice the gate electrodes receiving the same phase of clocking signal may be in a comb structure, with the gate electrodes forming the teeth of the comb structure. The spine, or back, of the comb is then ohmically contacted and connected by top-metallization and bond wires to the clocking signal connections.

Figure 2:
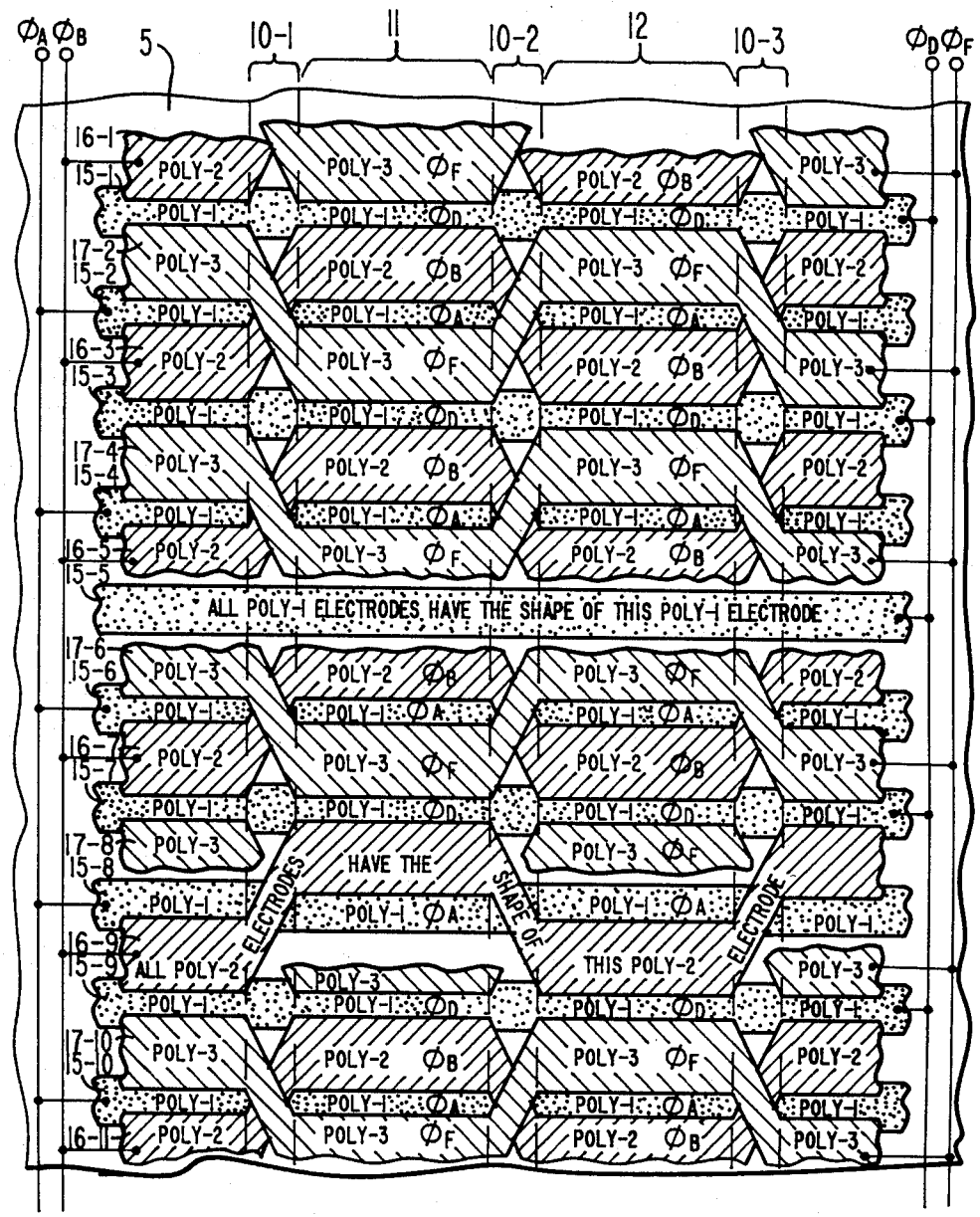
FIG. 2 is a lay-out of a gate electrode structure in three polysilicon layers, suitable for four-phase clocking of adjacent charge transfer channels, so as to transfer charge in opposite directions in these channels in accordance with the invention.
Figure 3:
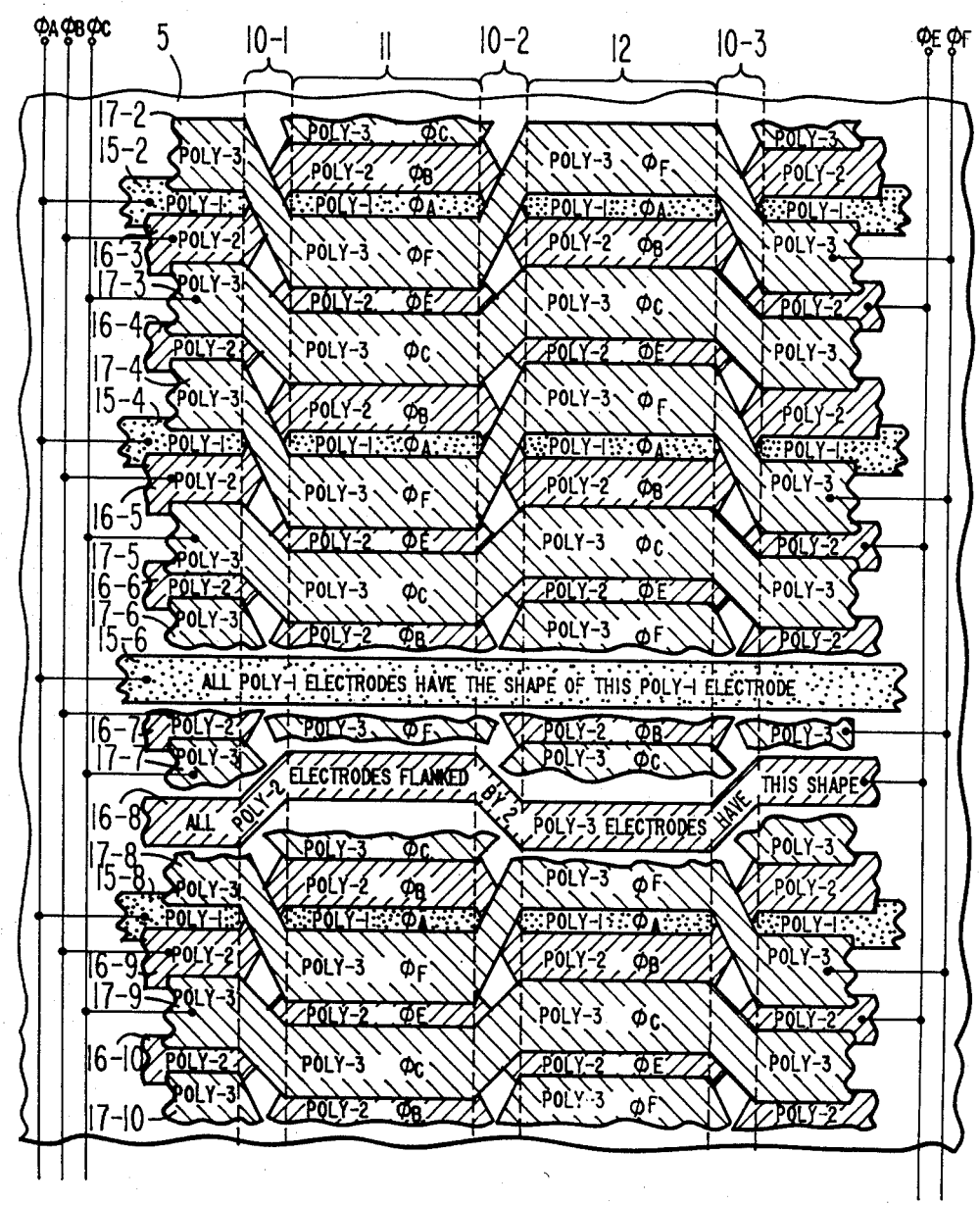
FIG. 3 is a lay-out of a gate electrode structure in three polysilicon layers suitable for five-phase clocking of adjacent charge transfer channels, so as to transfer charge in opposite directions in those channels, in accordance with the invention.

A set 15 of gate electrodes, straight along their width, are formed in the first layer of polysilicon and cross the charge transfer channels 11, 12 at regular intervals. (The terms "length" and "width" respective to CCD gate electrodes are used in accordance with the convention amongst CCD engineers. That is, the length of the gate electrode is measured in the direction of charge transfer; and the width in the direction normal to charge transfer. That is, the length of the gate electrodes in FIGS. 1, 2 and 3 is in the direction from top to bottom of figure; and the width, in the direction from left to right of figure.) The odd-suffix gate electrodes 15-1, 15-3, 15-5 of set 15 of first-layer-polysilicon gate electrodes connect to $\phi_D$ clock phase terminal; the even-suffix gate electrodes 15-2, 15-4, 15-6 of set 15 connect to $\phi_A$ clock phase terminal. The set 15 of gate electrodes in the first polysilicon layer shield the underlying semiconductor substrate from the electrostatic induction effects of the cross-overs in the overlying second and third polysilicon layers, which will be presently described. In preferred embodiments of the invention, then, the gate electrodes straight along their width will be in the first polysilicon layer. Portions of the second- and third-polysilicon-layer gate electrodes overlying the first-polysilicon-layer gate electrode 15-4 are cut away in FIG. 1 to reveal the shape of that representative first-polysilicon-layer gate electrode.

A set 16 of gate electrodes in the second polysilicon layer meander over channel stops 10-1, 10-2, 10-3 and across respective ones of the straight gate electrodes in the first polysilicon layer, to appear on opposite sides of them in adjacent ones of the plurality of charge transfer channels. The odd-suffix gate electrodes 16-1, 16-3, 16-5 of set 16 connect to $\phi_B$ clock phase terminal; the even-suffix gate electrodes 16-2, 16-4, 16-6 of set 16 connect to $\phi_E$ clock phase terminal. FIG. 1 has cut away in it the portions of third-polysilicon-layer gate electrodes overlapping the straight first-polysilicon-layer gate electrode 15-5 and the cross-meandering second-polysilicon-layer gate electrode 16-6, to make this relationship easier to perceive. In charge transfer channel 11 the second-polysilicon-layer gate electrode 16-6 is above the first-polysilicon-layer gate electrode 15-5, as depicted in FIG. 1, and is clocked with the next successive clock-phase. This is so of every straight first-polysilicon-layer gate electrode and cross-meandering second-polysilicon-layer gate electrode pair that crosses the charge transfer channel 11. So charge transfer tends to be upward in charge transfer channel 11 as depicted in FIG. 1.

In charge transfer channel 12 the second-polysilicon-layer gate electrode 16-6 is below the first-polysilicon-layer gate electrode in 15-5, as depicted in FIG. 1, but is clocked with the next successive clock-phase. This is so of every straight first-polysilicon-layer gate electrode and cross-meandering third-polysilicon-layer gate electrode pair that crosses the charge transfer channel 12. So charge transfer tends to be downward in charge transfer channel 12 as depicted in FIG. 1.

A set 17 of gate electrodes in the third polysilicon layer also meander over respective ones of the straight gate electrodes in the first polysilicon layer, but meander in phasing opposite to the second-polysilicon layer gate electrodes. The odd-suffix gate electrodes 17-1, 17-3, 17-5 of set 17 connect to $\phi_C$ clock phase terminal; the even suffix gate electrodes 17-2, 17-4, 17-6 of set 17 connect to $\phi_F$ clock phase terminal. So, in the charge transfer channel 11 each first-polysilicon-layer gate electrode is followed by respective second- and third-polysilicon-layer gate electrodes clocked with successively later clocking phases in the upward direction in FIG. 1, which causes charge transfer in channel 11 to be in that upward direction. In charge transfer channel 12 each first-polysilicon-layer gate electrode is followed by respective second- and third-polysilicon-layer gate electrodes clocked with successively later clocking phases in the downward direction in FIG. 1, which causes charge transfer in channel 12 to be in that downward direction.

FIG. 2 depicts the gate electrode arrangement to four-phase clock the adjacent CCD shift registers 11, 12 for opposite directions of charge transfer. The six-phase-clocking gate electrode structure of FIG. 1 is modified to omit the third-polysilicon-layer gate electrodes receptive of $\phi_C$ clock phase and to omit the second-layer-polysilicon-layer gate electrodes receptive of $\phi_E$ clock phase. The resulting gate electrode structure is compressed along the lengths of the charge transfer channels, to eliminate the spacings between successive gate electrodes and to overlap their edges appropriately. $\phi_A$, $\phi_B$, $\phi_D$ and $\phi_F$ connections are then arranged to receive the successive four phases $\phi_1$, $\phi_2$, $\phi_3$ and $\phi_4$ of clocking signal, to transfer charge upward in charge transfer channel 11 and downward in charge transfer channel 12.

FIG. 3 depicts the gate electrode arrangement to five-phase clock the adjacent CCD shift registers 11, 12 for opposite directions of charge transfer. The sixphase-clocking gate electrode structure of FIG. 1 is modified to omit the first-polysilicon-layer gate electrodes receptive of $\phi_D$ clock phase. The resulting gate electrode structure is compressed vertically along the lengths of the charge transfer channels, to eliminate the spacings between successive gate electrodes and to overlap their edges appropriately. $\phi_A$, $\phi_B$, $\phi_C$, $\phi_E$ and $\phi_F$ connections are then arranged to receive the successive five phases $\phi_1$, $\phi_2$, $\phi_3$, $\phi_4$ and $\phi_5$ of clocking signal, to transfer charge upward in charge transfer channel 11 and downward in charge transfer channel 12.

Figure 4:
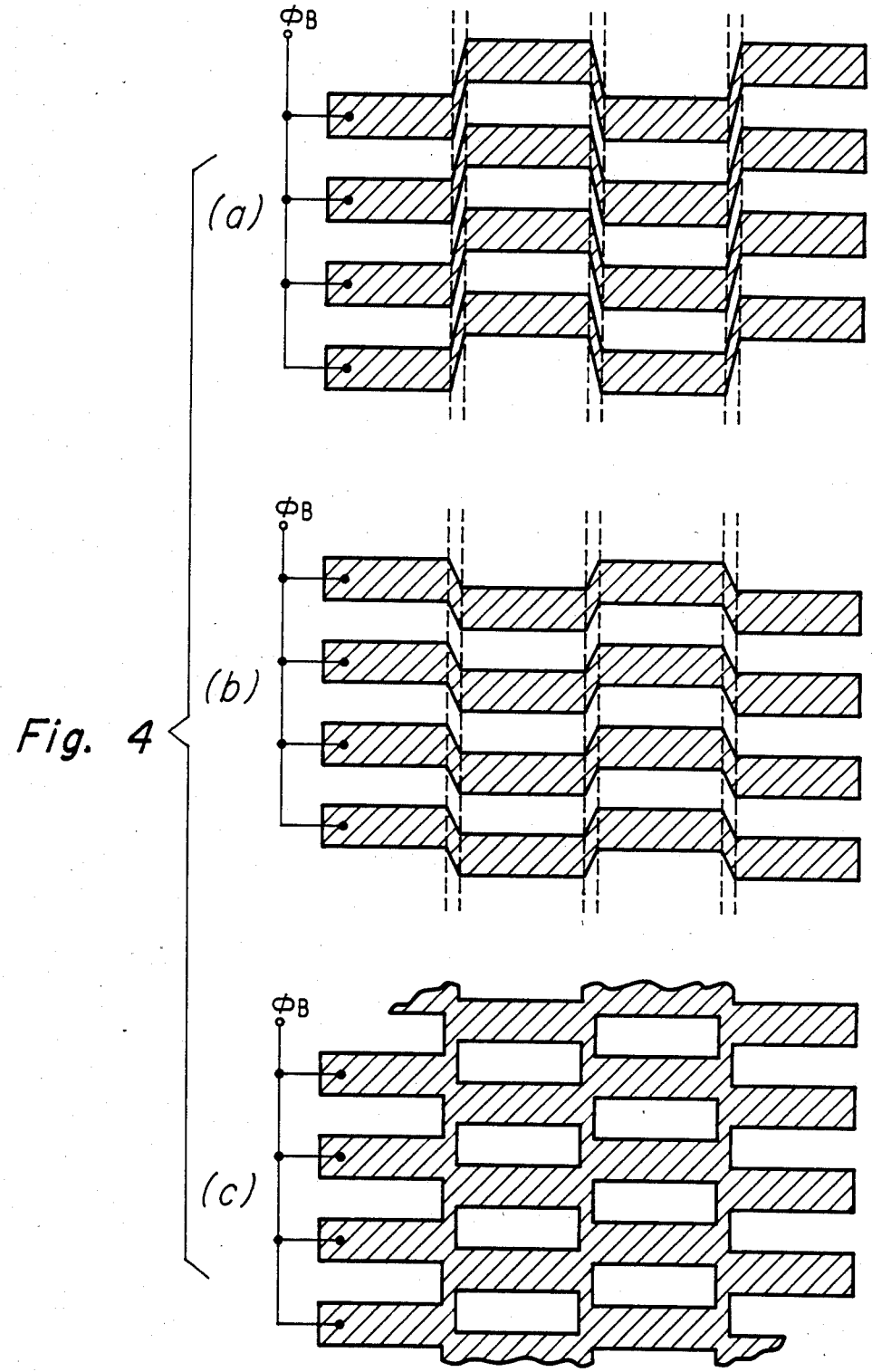
FIG. 4 and FIG. 5 depict modifications of lay-out that can be made to FIG. 1 structure, for example, to form other embodiments of the invention.
Figure 5:
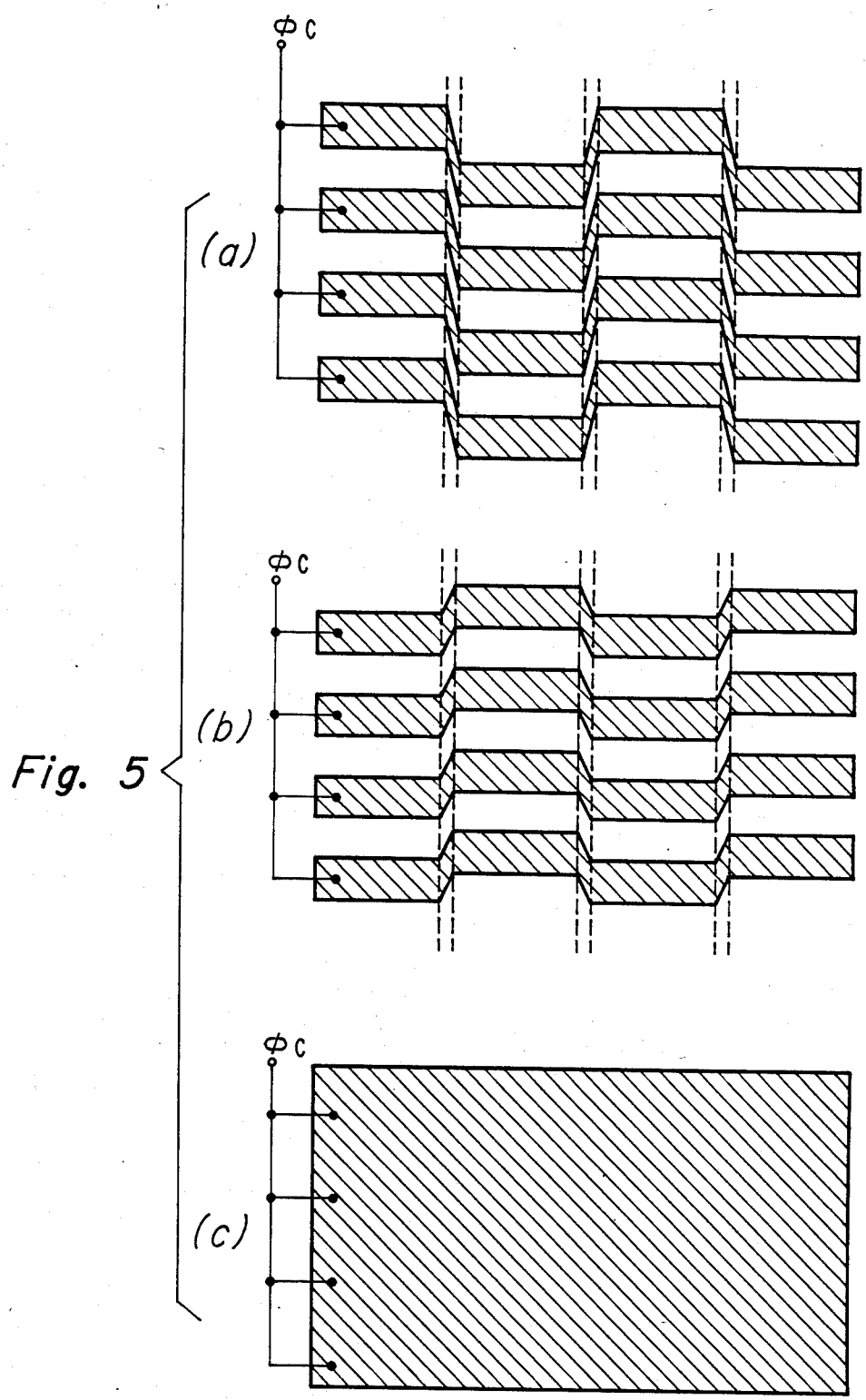

FIG. 4 in its a, b and c portions shows alternative second-polysilicon-layer gate electrode structures that can be used when apparatus similar to that of FIG. 1 is to be clocked three-phase. FIG. 5 in its a, b, and c portions shows alternative third-polysilicon-layer gate electrode structures that can be used when apparatus similar to that of FIG. 1 is to be clocked three-phase. Straightforward connection of $\phi_A$ and $\phi_D$ to receive $\phi_1$, connection of $\phi_B$ and $\phi_E$ to receive $\phi_2$, and connection of $\phi_C$ and $\phi_F$ to receive $\phi_3$ in FIG. 1 will result in having second- and third-layer-polysilicon gate electrode structures as shown in FIGS. 4a and 5a.

Modifying that parallelled CCD shift register arrangement to replace the second- and third-layer-polysilicon gate electrode structures of FIGS. 4a and 5a with those of FIGS. 4b and 5b is an advantageous way to provide for three-phase clocking. With this modification the second- and third-polysilicon-layer gate electrodes cross-meander only across each other and not across the first-polysilicon-layer gate electrodes. The steepness of the diagonal connections in the channel stop regions is less severe, and these connections thus widen to provide lower resistance along the width of the gate electrodes. This lowers the RC time constants associated with the gate electrodes and permits a higher clocking rate with less clocking power consumption.

FIG. 4c shows a second-polysilicon-layer gate electrode structure close to that resulting when both the types of cross-over in FIGS. 4a and 4b are used together. Its RC time constant tends to be somewhat lower than that of the FIG. 4a or 4b configuration. Inasmuch as the semiconductor substrate in which the charge transfer channels repose is shielded from the electrostatic induction of the third-polysilicon-layer electrodes by the first- and second-polysilicon-layer electrodes, the gate electrode structures of FIGS. 5a and 5b can be replaced by a simple sheet electrode per FIG. 5c. The variant gate electrode structures of FIGS. 4c and 5c may replace respective gate electrode structures of FIG. 2 in corresponding layers of polysilicon.

When the parallelled charge transfer channels with multi-phase clocking during charge transfer as described above are used in the image register of an imager, during image integration time the dynamic multi-phase clocking is halted and a static multi-phase clocking is maintained. Generally speaking, the charge collecting capability of each multi-phase-clocked charge transfer stage increases with decrease in the number of gate electrodes biased throughout image integration so as to erect barrier potential in the portions of the charge transfer channels thereunder. This comes about because of the concomitant increase in the number of remaining gate electrodes available to be biased during image integration to maintain a well for collection of photocharge in the portions of the charge transfer channels thereunder. However, during charge transfer at least two clock phases must be used to maintain the shifting barrier potentials required to keep separation between the charge packets descriptive of respective image elements. If only the gate electrodes receptive of one phase of clocking are biased to erect barrier potentials during image integration, the collection wells will overflow when dynamic clocking is resumed after image integration. (This overflow is disposed of to the anti-blooming drains in the image register where such drains are used; otherwise, the charge packets descriptive of respective image elements are admixed, which is undesirable in most imager applications.) So the usable charge handling capability of each transfer stage is maximum when only two of the clock phases are used for erecting barrier potentials during times of image integration, as well as during times of charge transfer.

When parallelled charge transfer channels with three-phase clocking during charge transfer (as described above) are used in the image register, there are two ways to bias the image register gate electrodes during image integration times, while maintaining parallel alignment of the image elements being sensed in adjacent transfer channels. One way biases the meandering gate electrodes (or the corresponding gate electrode structures) to erect barrier potentials in the portions of the charge transfer channels under them, while biasing the gate electrodes straight along their widths to induce wells for photocharge in the portions of the charge transfer channels under them. The other way is to reverse these bias conditions. These two ways of biasing during image integration times have a half-image-element offset between their respective image elements, and they can be alternated field-to-field to provide interlaced image sampling.

When parallelled charge transfer channels with four-phase or six-phase clocking during charge transfer (as described above) are used in the image register, parallel alignment of image elements is achieved by biasing at least one of the two sets of gate electrodes straight along their width and receptive of a phase of clocking signal, so as to erect barrier potentials during image intetgration times in the portions of the charge transfer channels thereunder. Where only one set of straight electrodes is so biased during each image integration time, the sets may be alternately so biased thus to provide interlace. When dynamic clocking is resumed, there may be spill-over of excess collected photocharge. Both sets of straight electrodes are biased to erect barrier potentials during image integration, which desirably reduces dark current collection. Then, prior to resumption of dynamic clocking, one clock phase is dropped to eliminate the induction of barrier potential in the portions of the charge transfer channels thereunder. There will be no excess of collected photocharge to spill over. The dropped phase may be alternated from field to field to provide interlaced image sampling.

When parallelled charge transfer channels with five-phase clocking during charge transfer (as described above) are used in an image register, and where field-to-field interlace of image samples is not used, it is advantageous during image integration to bias only the interlaced pairs of meandering gate electrodes (e.g., those receptive of $\phi_c$ and $\phi_E$ clock phases in FIG. 3) so as to erect barrier potentials in the portions of the charge transfer channels thereunder. Image integration can then be carried forward by simply halting dynamic clocking during image integration times, without having to change the pattern of clocking signals as between static clocking and normal dynamic clocking. There is no spill-over of excess collected photochange. Where interlace of image samples from field to field is to be used, the way of image integration just described can be alternated with a way of image integration wherein only the gate electrodes straight along their width are biased to erect potential barriers in the portions of the charge transfer channels thereunder. When dynamic clocking is resumed, there may be some spill-over of excess collected photocharge.

In implementing the invention in smaller CCD arrays or ones clocked at slower clock rates, one may form the upper most gate electrodes in the top metallization rather than using a third polysilicon layer. But, in larger CCD arrays operated at faster clock rates, there is a practical necessity to connect the CCD electrodes to top metallization busses at frequent spatial intervals. This is done to keep the undesirable effects of gate electrode resistance under control, and it precludes the formation of uppermost gate electrodes in the top metallization.

What is claimed is:

1. In combination:
a clock signal generator for generating plural-phase clock signals;
a semiconductor substrate including a plurality of charge transfer channels formed in a major surface thereof;
a first conductive layer insulated from and overlying said major surface, said first conductive layer having gaps therein for defining a first plurality of gate electrodes in said first conductive layer which cross the length of said charge transfer channels at regularly spaced intervals and are straight across their width so as to be aligned in adjacent ones of said charge transfer channels;
second and third conductive layers insulated from each other and insulated from and successively overlying said first conductive layer, with the first conductive layer being closest to said major surface of said substrate, including second and third pluralities of gate electrodes, respectively, which meander across corresponding ones of said first plurality of gate electrodes so as to be on opposite sides of said corresponding ones of said first plurality of gate electrodes in adjacent ones of said plurality of charge transfer channels; and
means for applying respective phases of said plural-phase clock signal to said first, second and third pluralities of gate electrodes such that the direction of charge transfer along the length of one charge transfer channel is opposite the direction of charge transfer along the length of a charge transfer channel adjacent said one charge transfer channel.

2. The combination of claim 1, wherein:
said clock signal generator develops a three-phase clock signal; and
said first, second and third conductive layers receive first, second and third phases, respectively, of said three-phase clock signal.

3. A combination as set forth in claim 1 wherein:
said clock signal is a four-phase clock signal;
said first conductive layer has gaps therein for defining a fourth plurality of gate electrodes in said first conductive layer, said fourth plurality of gate electrodes crossing the length of said charge transfer channels at regularly spaced intervals and being straight across there with so as to be aligned in adjacent ones of said charge transfer channels; and
said first, second, third and fourth plurality of gate electrodes are receptive of first, second, fourth and third phases of said four-phase clock signal, respectively.

4. A combination as set forth in claim 1 wherein:
said clock signal is five-phase; and
said second and third conductive layers define fourth and fifth pluralities of gate electrodes in said second and third conductive layers, respectively, respective ones of which meander across each other as they cross adjacent ones of said charge transfer channels and are positioned between successive gate electrodes of said first plurality.

5. A combination as set forth in claim 4 wherein:
said first, second, third, fourth and fifth pluralities of gate electrodes are receptive of first, second, fifth, fourth and third phases of said clock signal, respectively.

6. A combination as set forth in claim 1 wherein:
said clock signal is a six-phase clock signal; and
said first, second and third conductive layers define fourth, fifth and sixth pluralities of gate electrodes, respectively, said fourth plurality of gate electrodes crossing the length of said charge transfer channels at regular intervals and being straight across their width so as to be aligned in adjacent ones of said charge transfer channels and respective ones of said fifth and sixth plurality of gate electrodes meandering across corresponding ones of said fourth plurality of gate electrodes so as to be on opposite sides of said corresponding ones of said fourth plurality of gate electrodes in adjacent ones of said plurality of charge transfer channels.

7. A combination as set forth in claim 6 wherein:
said first, second, third, fourth, fifth and sixth plurality of gate electrodes are receptive of first, second, sixth, fourth, fifth, and third phases of said clock signal, respectively.

* * * * *